United States Patent [19]

Tonegawa et al.

[11] Patent Number: 5,748,054
[45] Date of Patent: May 5, 1998

[54] HIGH FREQUENCY HYBRID SWITCH OPERABLE IN ANTENNA DIVERSITY TYPE PORTABLE TELEPHONE

[75] Inventors: Ken Tonegawa, Kyoto; Norio Nakajima, Takatsuki; Mitsuhide Kato; Koji Tanaka, both of Shiga-ken; Tatsuya Ueda, Kyoto; Koji Furutani, Shiga-ken, all of Japan

[73] Assignee: Murata Manufacturing Co., Ltd., Japan

[21] Appl. No.: 593,360

[22] Filed: Jan. 29, 1996

[30] Foreign Application Priority Data

Jan. 30, 1995 [JP] Japan ............ 7-012693

[51] Int. Cl.$^6$ ................ H01P 1/15; H04B 1/44
[52] U.S. Cl. ................ 333/104; 333/262; 455/78; 455/277.1
[58] Field of Search .............. 333/101, 103, 333/104, 262; 455/78, 82, 83, 277.1; 327/99, 415, 493, 504

[56] References Cited

U.S. PATENT DOCUMENTS

| | | | |
|---|---|---|---|
| 5,159,296 | 10/1992 | Nelson | 333/103 |
| 5,375,257 | 12/1994 | Lampen | 455/277.1 X |
| 5,499,000 | 3/1996 | Morikawa et al. | 333/104 |
| 5,507,011 | 4/1996 | Chigodo et al. | 333/101 X |
| 5,519,364 | 5/1996 | Kato et al. | 333/103 |

OTHER PUBLICATIONS

Stacheko, "Multifunction Diode Device", *RCA Technical Notes*, TN No. 957, Mar. 15, 1974; A Publication of RCA, Princeton, NJ; pp. 1–2.

Waugh, "Broadbanding the Shunt Pin–Diode SPDT Switch", *Microwave Journal*, vol. 18, No. 2, Feb. 1975; pp. 55, 59–60.

*Primary Examiner*—Robert Pascal
*Assistant Examiner*—Barbara Summons
*Attorney, Agent, or Firm*—Ostrolenk, Faber, Gerb & Soffen, LLP

[57] ABSTRACT

A compact high frequency hybrid switch suitably operated in a diversity-type antenna system. A high frequency hybrid switch is comprised of: first to fourth ports; a first high frequency switch circuit for switching a connection established between the first port and the third port; and a second high frequency switch circuit for selecting one from two connections respectively established between the first port and the fourth port, and between the second port and the fourth port. The first and second high frequency switch circuits include respective series and parallel arrangements of diodes, capacitors and distributed constant signal lines which reduce the size and improve the reliability of the switch.

23 Claims, 12 Drawing Sheets

FIG. 2

| OP No. | Vcc | | | | Tx | ANT1-Rx | ANT2-Rx |
|---|---|---|---|---|---|---|---|
| | 1 | 2 | 3 | 4 | | | |
| OP1 | o | + | + | o | × | ○ | × |
| OP2 | + | o | o | + | ○ | × | ○ |
| OP3 | + | o | + | o | ○ | ○ | × |

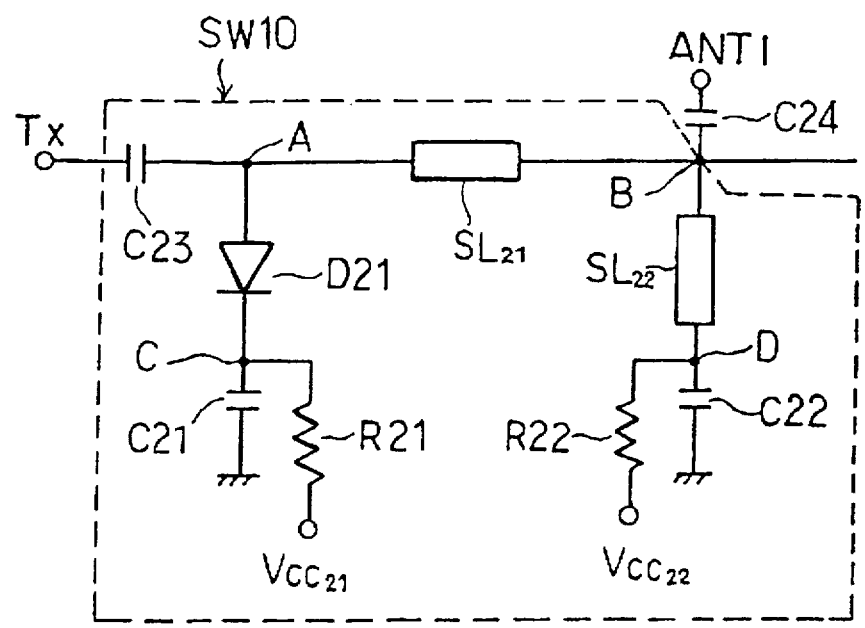

| OP No. | Vcc | | | ANT1-Rx | ANT2-Rx |
|---|---|---|---|---|---|
| | 33 | 34 | 35 | | |
| OP 1,3 | + | 0 | 0 | ○ | × |
| OP 2 | 0 | 0 | + | × | ○ |

FIG. 8

| OP No. | Vcc | | | | Tx | ANT1-Rx | ANT2-Rx |
|---|---|---|---|---|---|---|---|
| | 1 | 2 | 43 | 44 | | | |
| OP1 | O | + | + | O | X | O | X |
| OP2 | + | O | O | + | O | X | O |
| OP3 | + | O | + | O | O | O | X |

| OP No. | Vcc | | | ANT1-Rx | ANT2-Rx |
|---|---|---|---|---|---|
| | 53 | 54 | 55 | | |
| OP 1,3 | O | O | + | ○ | × |
| OP 2 | + | O | O | × | ○ |

FIG. 12

| OP No. | Vcc | | | | | | Tx-ANT1 | Tx-ANT2 | ANT1-Rx1 | ANT2-Rx2 |
|---|---|---|---|---|---|---|---|---|---|---|
| | 61 | 62 | 63 | 64 | 65 | 66 | | | | |
| OP1 | + | ○ | + | ○ | ○ | + | ○ | × | × | × |
| OP2 | + | ○ | ○ | + | ○ | + | × | ○ | × | × |
| OP3 | ○ | + | + | + | ○ | + | × | ○* | ○ | × |
| OP4 | + | ○ | + | ○ | + | ○ | ○* | × | × | ○ |

*(UNDER CONNECTION STATE, BUT TRANSMISSION IS NOT OPERATED)

5,748,054

HIGH FREQUENCY HYBRID SWITCH OPERABLE IN ANTENNA DIVERSITY TYPE PORTABLE TELEPHONE

BACKGROUND OF THE INVENTION

1. Field of the Invention

The present invention generally relates to a high frequency hybrid switch for switching signal paths used to receive signals by selecting, for instance, a plurality of antennas of a portable telephone, or to transmit signals. More specifically, the present invention is directed to such a high frequency hybrid switch utilizing a diode and a distributed constant signal line.

2. Description of the Related Art

In portable telephones, for instance, the antenna diversity system has been employed so as to mitigate adverse influences causing deterioration in the quality of reception signals caused by the fading phenomenon. The antenna diversity system is such a system for switching among a plurality of antennas to improve reception of a reception signal by a receiver circuit, in which when the adverse influence caused by the fading phenomenon of the signal received from one antenna is increased, one antenna is disconnected and another is connected to thereby receive the signal. As a result, the adverse influence caused by the fading phenomenon may be reduced. The typical antenna selecting (changing) switches used in the antenna diversity system are indicated in FIG. 16 and FIG. 17.

The antenna selecting switch shown in FIG. 16 contains a filter BEF and a switch SW. By operating the filter BEF and switch SW, a receiver circuit RX is selected between two antennas ANT1 and ANT2, and a connection between the antenna ANT1 and a transmitter $T_x$ is established/interrupted, so that a selection is made of these two antennas ANT1 and ANT2.

Another antenna selecting switch for the antenna diversity system as represented in FIG. 17 includes a diplexer DPX and a switch SW. A connection between a first antenna ANT1 and a receiver circuit $R_x$, and between a second antenna ANT2 and this receiver circuit $R_x$, and also another connection between the first antenna ANT1 and a transmitter circuit $T_x$ are selected by that antenna selecting switch to thereby select the first and second antennas.

As a switch SW employed as these antenna selecting switches, one conventional high frequency switch 161 is shown in FIG. 18, the high frequency switch 161 having first to third ports $P_{61}$ to $P_{63}$ connected to the above-explained two antennas and receiver circuit. The port $P_{61}$ is connected via a capacitor 164 to a cathode of a diode 165a. An anode of the diode 165a is connected via a capacitor 166a to the second port $P_{62}$. One end of a distributed constant signal line 167a is electrically connected to a junction point A between the anode of the diode 165a and the capacitor 166a. The distributed constant signal line 167a is arranged by a stripline having a length shorter than λ/4, assuming that the wavelength of the high frequency signal flowing through this switch 161 is selected to be "λ", or a micro stripline, or a coplanar guide line. The other end of the distributed constant signal line 167a is connected via a capacitor 168a to the ground potential. Also, one end of a resistor 169a is connected between the distributed constant signal line 167a and the capacitor 168a, whereas the other end of the resistor 169a is connected to a control voltage terminal $V_{cc1}$.

The first port $P_{61}$ is connected via a capacitor 164 to a distributed constant signal line 171 arranged in a similar manner to the above-explained distributed constant signal line 167. The other end of the distributed constant signal line 171 is connected to the ground potential.

Furthermore, a cathode of a diode 165b is connected via a capacitor 164 to the first port $P_{61}$. An anode of this diode 165b is connected via a capacitor 166b to the third port $P_{63}$. Similar to the diode 165a, a series circuit arrangement constructed of the distributed constant signal line 167b and the capacitor 168b is connected between the anode of the diode 165b and the ground potential. One end of a resistor 169b is connected to a junction point between the distributed constant signal line 167b and the capacitor 168b. The other end of the resistor 169b is connected to another control voltage terminal $V_{C2}$.

In the high frequency switch 161, since different control voltages are applied to the first control voltage terminal $V_{C1}$ and the second control voltage terminal $V_{C2}$, it is possible to realize a condition wherein the port $P_{61}$ is connected either to the second port $P_{62}$, or the third port $P_{63}$. For instance, when the positive control voltage is applied to the first control voltage terminal $V_{C1}$ whereas the negative control voltage is applied to the second control voltage terminal $V_{C2}$, a bias voltage along the forward direction is applied to the diode 165a whereas a bias voltage along the reverse direction is applied to the diode 165b. That is to say, since the capacitors 166a, 168a, 164, 166b, and 168b limit the circuit portion through which a DC current flows, the control current supplied from the first control voltage terminal $V_{C1}$ is blocked, and may flow into a circuit portion containing the distributed constant signal line 167a, the diode 165a, and the distributed constant signal line 171, so that the diode 165a is brought into the ON state. On the other hand, since the bias voltage in the reverse direction is applied to the diode 165b, this diode 165b is brought into the OFF state.

As to the high frequency signal supplied from the second port $P_{62}$, since the distributed constant signal line 167a is constructed as in the above-described manner, one end of the distributed constant signal line 167a can be set to the ground potential in view of the high frequency. The impedance of the series circuit arrangement constituted by the distributed constant signal line 167a and the capacitor 168a becomes infinite, as viewed from the junction point A, because of the impedance inversion of the λ/4 signal. As a consequence, the high frequency signal supplied from the second port $P_{62}$ flows into the first port $P_{61}$.

On the other hand, when the negative control voltage is applied to the first control voltage terminal $V_{C1}$ and the positive control voltage is applied to the second control voltage terminal $V_{C2}$, the bias voltage in the reverse direction is applied to the diode 165a, and also the bias voltage in the forward direction is applied to the diode 165a in a manner opposite to that of the above-described case. As a consequence, the diode 165a is set to the OFF state and the diode 165b is set to the ON state. Thus, no signal flows between the second port $P_{62}$ and the first port $P_{61}$, but a signal may flow between the first port $P_{61}$ and the third port $P_{63}$. Also in this case, since the impedance of the series circuit constructed of the distributed constant signal line 167b and the capacitor 168b becomes infinite, as viewed from the junction point B, no high frequency signal may flow into the distributed constant signal line 167b.

The distributed constant signal lines 167a and 167b have the following functions. That is to say, they constitute a current path for supplying the control current to the diodes 165a and 165b. With respect to the high frequency signal, they increase the impedances on the side of the distributed constant signal lines 167a and 167b, as viewed from the junction points A and B, so that the insertion loss and the reflection loss are lowered.

As described above, it is possible to realize a condition wherein the first port $P_{61}$ is switched into the second port $P_{62}$ or the third port $P_{63}$ by applying the positive and negative control voltages to the first and second control voltage terminals $V_{C1}$ and $V_{C2}$.

However, in the antenna selecting switches indicated in FIG. 16 and FIG. 17, since a large number of discrete components are employed, it is rather difficult to make them compact. Also, the trend is to increase total number of circuit components so as to equalize the reception sensitivities of the two antennas ANT1 and ANT2. In view of this trend, these antenna selecting switches cannot be made compact. However, there is another problem in the digital TDD (time divisional digital communication) system employed in portable telephones. That is, when the frequency of the transmission signal is equal to, or approximated to that of the reception signal, it is difficult to switch the transmitter circuit and the receiver circuit in the above-described filter and diplexer.

SUMMARY OF THE INVENTION

An object of the present invention is therefore to provide a high frequency hybrid switch operable in antenna diversity type portable telephones and the like.

A high frequency hybrid switch, according to one form of the present invention, is comprised of: first to fourth ports, a first high frequency switch circuit for switching a connection established between the first port and the third port; and a second high frequency switch circuit for selecting one from two connections respectively established between the first port and the fourth port, and between the second port and the fourth port. The first high frequency switch circuit and the second high frequency switch circuit may be realized by various circuit arrangements.

In the high frequency hybrid switch according to one aspect of the invention, the first high frequency switch circuit includes a two port type high frequency circuit having said first and third ports, and the second high frequency switch circuit includes a three port type high frequency circuit having said first, second and fourth ports.

In the high frequency hybrid switch according to another aspect of the invention, the first high frequency switch circuit includes a first diode or a first distributed constant signal line, respectively connected between said first and third port. The second high frequency switch circuit includes a series circuit comprised of second and third diodes, connected between said first and second port, or a series circuit comprised of second and third distributed constant signal lines, connected between said first and second port.

A high frequency hybrid switch, according to a second form of the invention, is comprised of: first to fifth ports; a first high frequency switch circuit for switching a connection established between the first port and the third port; a second high frequency switch circuit for switching a connection established between the second port and the fourth port; and a third high frequency switch circuit for selecting one from two connections established between the first port and the fifth port, and between the second port and the fifth port.

According to one aspect of the invention, the first high frequency switch circuit includes a two port type high frequency circuit having the first and third ports. Also, the second high frequency switch includes a two port type high frequency circuit having the second and fourth ports. Further, the third high frequency switch includes a three port type high frequency circuit having said first, second and fifth ports.

According to another aspect of the invention, the first high frequency switch circuit includes a first diode or a first distributed constant signal line, respectively connected between said first port and third port. Also, the second high frequency switch circuit includes a second diode or a second distributed constant signal line, respectively connected between said second port and fourth port. Further, the third high frequency switch circuit includes:

a series circuit comprised of third and fourth diodes, connected between said first and second port, or a series circuit comprised of third and fourth diodes, connected between said first and second port.

Moreover, according to preferred aspects of the invention, the high frequency hybrid switch circuit may further comprise a resistor connected in parallel to at least one of said diodes.

Additionally, the high frequency hybrid switch circuit may further comprise a distributed constant signal line and a capacitor series-connected to said distributed constant signal line, which are connected in parallel to at least one of said diodes.

The high frequency hybrid switch circuit according to the present invention may further comprise a capacitor connected to at least one of said diodes.

Furthermore, the above-explained first high frequency switch circuit and second high frequency switch circuit are assembled into, for instance, a signal chip. As a consequence, as compared with the conventional selecting switch with the filters, the total quantity of circuit components can be reduced and the high frequency hybrid switch according to the present invention can be made compact.

Also, both the first high frequency switch circuit and the second high frequency switch circuit are so arranged as to be properly connected among five ports. Then, for instance, when this high frequency hybrid switch is applied as the selecting switch for switching two antennas, two receiver circuits, and one transmitter circuit, the first and second ports are connected to the respective antennas, the third port is connected to the transmitter circuit, and the fourth and fifth ports are connected to the respective receiver circuits. As a result, this high frequency hybrid switch may be suitably utilized as the after detection diversity type selecting switch.

Other features and advantages of the present invention will become apparent from the following description of the invention which refers to the accompanying drawings.

BRIEF DESCRIPTION OF THE DRAWINGS

A more complete understanding of the present invention may be gained by reading the subsequent detailed description with reference to the drawings, in which:

FIG. 2 is a control operation explanatory diagram for explaining a control signal and the like of the high frequency hybrid switch indicated in FIG. 1;

FIG. 3 is a circuit diagram for showing a first high frequency switch circuit of a high frequency hybrid switch according to a second embodiment of the present invention;

FIG. 4 is an explanatory diagram for explaining a control operation of the first high frequency switch circuit indicated in FIG. 3;

FIG. 8 is an explanatory diagram for explaining a control operation of the first high frequency switch circuit indicated in FIG. 7;

FIG. 12 is an explanatory diagram for explaining a control operation of the first high frequency switch circuit indicated in FIG. 11;

DETAILED DESCRIPTION OF EMBODIMENTS OF THE INVENTION

Referring now to drawings, a description will be made of a high frequency hybrid switch according to preferred embodiments of the present invention for a better understanding of the present invention.

The below-mentioned embodiments describe high frequency hybrid switches suitably used in antenna switching circuits of portable telephones which employ of the antenna diversity system and the after detection diversity system. The high frequency hybrid switch according to the respective embodiments is constructed of two ports ANT1, ANT2 connected to two antennas, a port $R_x$ connected to a receiver circuit, and a port $T_x$ connected to a transmitter circuit. This high frequency hybrid switch switches connections established between the two antenna ports ANT1, ANT2 and the transmitter/receiver ports $R_T/R_X$. These embodiments will now be sequentially explained.

HIGH FREQUENCY HYBRID SWITCH OF A FIRST EMBODIMENT

Figure 1:
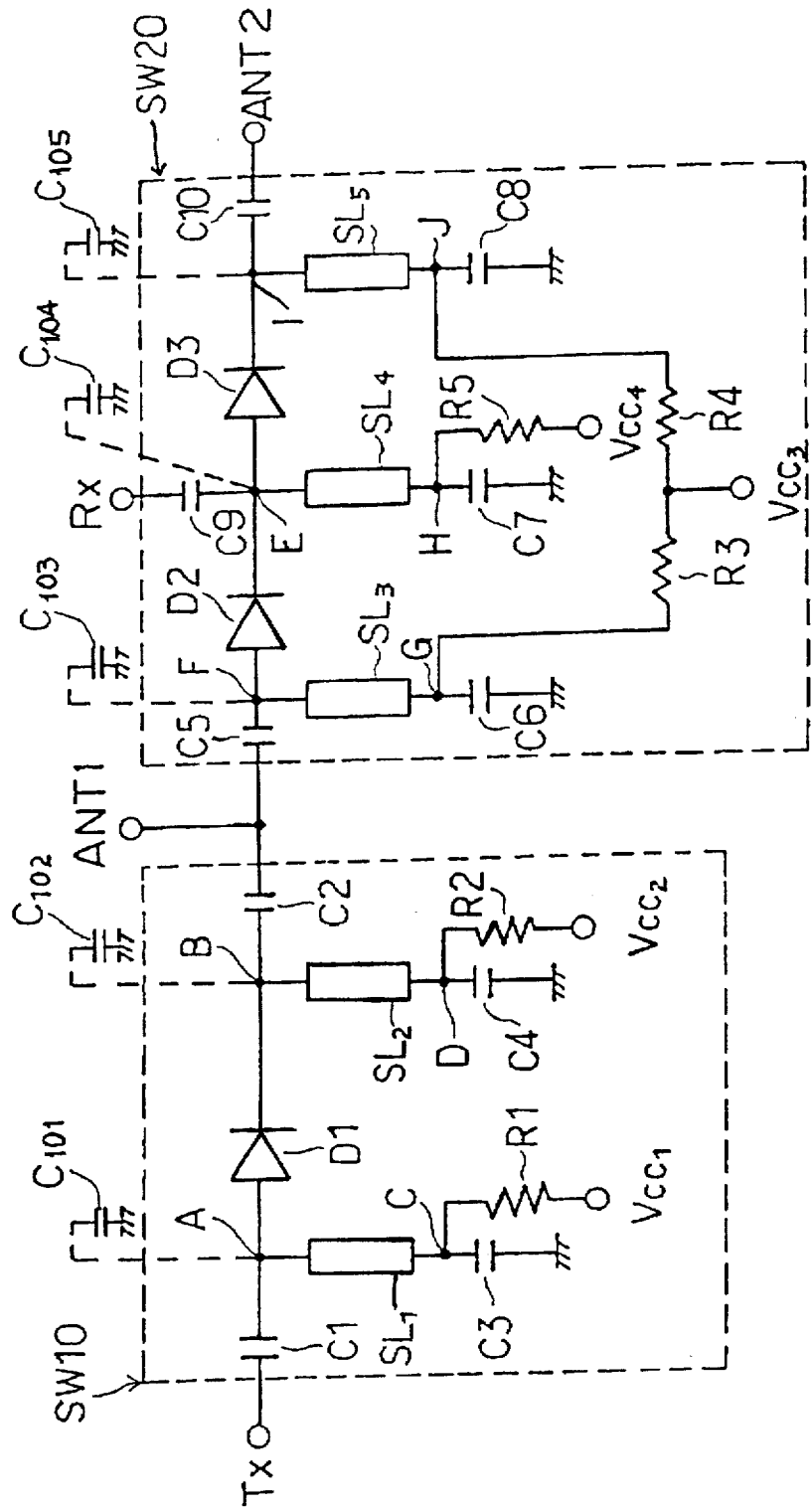
FIG. 1 is a circuit diagram for representing a high frequency hybrid switch according to a first embodiment of the present invention.

FIG. 1 represents a circuit diagram of a high frequency hybrid switch according to a first embodiment of the present invention. This high frequency hybrid switch is such a hybrid switch including four ports ANT1, ANT2, $R_x$, $T_x$, and a first high frequency switch circuit SW10, and also a second high frequency switch circuit SW20. The first high frequency switch circuit SW10 switches the connection established between the first antenna port ANT1 and the transmitter circuit port $T_x$. The second high frequency switch circuit SW20 switches the connection established between the first antenna port ANT1, the second antenna port ANT2, and the receiver circuit port $R_x$. Then, this hybrid switch is arranged on, for instance, a single chip.

In the first high frequency switch circuit SW10, a first diode D1 is connected between the first antenna port ANT1 and the transmitter port $T_x$. An anode of the first diode D1 is connected via a capacitor C1 to the transmitter circuit port $T_x$, and a cathode of this first diode D1 is connected via a capacitor C2 to the first antenna port ANT1. One end of a distributed constant signal line $SL_1$, is connected to a junction point "A" between the first diode D1 and the capacitor C1. The distributed constant signal line $SL_1$ is arranged as a stripline, a micro stripline, or a coplanar guide line, each of which having a length shorter than, or equal to $\lambda/4$, assuming now that a wavelength of a high frequency signal flowing through this high frequency switch circuit SW10 is selected to be "$\lambda$". The other end of the distributed constant signal line $SL_1$ is connected via a capacitor C3 to the ground potential. A control voltage terminal $V_{cc1}$ is connected via a resistor R1 to a junction point "C" between the distributed constant signal line $SL_1$ and the capacitor C3.

It should be noted that although the above-explained distributed constant signal line $SL_1$ is a so-called "$\lambda/4$ signal line", since there are actually influences of an inductance and a stray capacitance of the stripline, the stripline is constructed to thereby have the length shorter than, or equal to $\lambda/4$.

Also, the control voltage terminal $V_{cc1}$, controls the control voltage which is set to a proper voltage value by way of the resistor Ri interposed between this control voltage terminal $V_{cc1}$ and the junction point C. This resistor R1 is not always required.

Furthermore, one end of the distributed constant signal line $SL_2$ is connected to a junction point B between the first diode D1 and a capacitor C2. This distributed constant signal line $SL_2$ is arranged as a stripline, a micro stripline, or a coplanar guide line each of which having a length shorter than, or equal to $\lambda/4$, similar to the above-explained distributed constant signal line $SL_1$. Then, the other end of this distributed constant signal line $SL_2$ is connected via a capacitor C4 to the ground potential. Also, a control voltage terminal $V_{cc2}$ is connected to a junction point D between the distributed constant signal line $SL_2$ and the capacitor C4. A resistor R2 interposed between this junction point D and the control voltage terminal $V_{cc2}$ is employed so as to control, or adjust a control voltage which will be applied to the junction point D, and is therefore not always required.

In the second high frequency switch circuit SW20, second and third diodes D2 and D3 are connected via a capacitor C9 to the receiver circuit port $R_x$. A cathode of the second diode D2 is connected via a junction point E to a capacitor C9, and an anode thereof is connected via a capacitor C5 to the first antenna port ANT1. One end of a distributed constant signal line $SL_3$ is connected to a junction point "F" between the second diode D2 and the capacitor C5. The distributed constant signal line $SL_3$ is arranged as a stripline, a micro stripline, or a coplanar guide line, each of which having a length shorter than, or equal to λ/4 assuming now that a wavelength of a high frequency signal flowing through this high frequency switch circuit SW20 is selected to be "λ". It should be noted that although the above-explained distributed constant signal line $SL_3$ is a so-called "λ/4 signal line", since there are actually influences of an inductance and a stray capacitance of the stripline, the stripline is constructed to thereby have the length shorter than, or equal to λ/4. The other end of the distributed constant signal line $SL_3$ is connected via a capacitor C6 to the ground potential. A control voltage terminal $V_{cc3}$ is connected to a junction point "G" between the distributed constant signal line $SL_3$ and the capacitor C6. This control voltage terminal $V_{cc3}$ may be connected via a resistor R3 having a proper value to the junction point "G", so that the control voltage applied to the junction point "G" may be controlled.

The receiver circuit port $R_x$ is connected via a capacitor C9 to one end of a distributed constant signal line $SL_4$. It should be noted that similar to the distributed constant signal line $SL_3$, this distributed constant signal $SL_4$ is arranged as a stripline, a micro stripline, or a coplanar guide line, each of which having a length less than λ/4.

A control voltage terminal $V_{cc4}$ is connected via a resistor R5 to a junction "H" between the distributed constant signal line $SL_4$ and the capacitor C7.

Furthermore, an anode of a third diode D3 is connected via a capacitor C9 to the receiver port $R_x$, and a cathode thereof is connected via a capacitor C10 to the second antenna port ANT2. One end of a distributed constant signal line $SL_5$ is connected to a junction point between the cathode of the third diode D3 and the capacitor C10. The other end of the distributed constant signal line $SL_5$ is connected via a capacitor C8 to the ground potential. The distributed constant signal line $SL_5$ is constructed in a similar manner to that of the distributed constant signal line SL3. A control voltage terminal $V_{cc3}$ is connected to a junction point "J" between this distributed constant signal line $SL_5$ and the capacitor C8. It should also be noted that a resistor R4 may be interposed between the control voltage terminal $V_{cc3}$ and the junction point J. A common control voltage derived from the commonly used control voltage terminal $V_{cc3}$ is applied to the junction G and the junction J in this second high frequency switch circuit SW20.

Furthermore, as indicated by broken lines in FIG. 1, capacitors $C_{101}$ to $C_{105}$ may be connected between the respective junction points A, B, F, E, I and the reference potential. In this case, the characteristic impedance can be corrected by properly selecting the capacitances of these capacitors $C_{101}$ to $C_{105}$, so that the insertion loss and the reflection loss of the high frequency switch can be lowered. In addition, the lengths of the distributed constant signal lines $SL_1$ to $SL_5$ may be shortened, so that the first and second high frequency circuits SW10 and SW20 can be made compact.

It should also be noted that all of the capacitors $C_{101}$ to $C_{105}$ indicated by the broken lines in FIG. 1 need not be employed, but some of them may be connected between the respective junction points A, B, F, E, I and the reference potential.

Operations of the high frequency hybrid switch with the above-described circuit arrangement will now be described with reference to a control operation explanatory diagram indicated in FIG. 2. In FIG. 2, symbol "$V_{cc}$" indicates control voltages (+being a positive voltage, O being the ground potential) applied to the respective control voltage voltages $V_{cc1}$ to $V_{cc4}$. Symbol "$T_x$", represents open/close conditions between the first antenna port ANT1 and the transmitter circuit port $T_x$ (O being a connection state, X being an open state). Further, symbols "ANT1-$R_x$" and "ANT2-$R_x$" represent connection conditions between the respective ports (O being a connection state, X being an open state).

(1) RECEIVING OPERATION FROM FIRST ANTENNA (OP1)

First, in the first high frequency switch circuit SW10, the ground potential (O=V) is applied as the control voltage to the control voltage terminal $V_{cc1}$, and a positive power supply voltage (+$V_{cc}$) is applied to the control voltage terminal $V_{cc2}$. In this case, the bias voltage is applied to the first diode D1 in the reverse direction, so that the first diode D1 is turned OFF. As a result, the first high frequency switch circuit SW10 is brought into the OFF state, so that the circuit between the first antenna port ANT1 and the transmitter circuit port $T_x$ is interrupted.

In the second high frequency switch circuit SW20, the power supply voltage (+$V_{cc}$) is applied as the control voltage to the control voltage terminal $V_{cc3}$, and the control voltage terminal $V_{cc4}$ is connected to the ground potential. In this case, the bias voltage is applied to the second diode D2 in the forward direction, whereas the bias voltage is applied to the third diode D3 in the reverse direction. Since the capacitor C5 to C10 control the circuit portion through which the DC current flows, the control current supplied from the control voltage terminal $V_{cc3}$ is cut, and the control current may flow into such a circuit portion containing the distributed constant signal line $SL_3$, the second diode D2, the distributed constant signal line $SL_4$, and the resistor R5,so that the second diode D2 is brought into the ON state. It should be noted that the bias voltage in the reverse direction is applied to the third diode D3 by the control voltages from the control voltage terminals $V_{cc3}$ and $V_{cc4}$, so that this third diode D3 is brought into the OFF state.

The series circuit constructed of the distributed constant signal line $SL_3$ and the capacitor C6 enables one end of the distributed constant signal line $SL_3$ to be set to the ground potential in view of the high frequency, and the impedance of this series circuit becomes infinite, as viewed from the junction point F by the λ/4 impedance inversion. Similarly, the impedance of the series circuit constructed of the distributed constant signal line $SL_4$ and the capacitor C7 also becomes infinite, as viewed from the junction point E. As a consequence, the high frequency signal received by the first antenna flows between the first antenna port ANT1 and the receiver circuit port $R_x$. Then, this high frequency signal is prohibited to flow either from the junction point F to the ground, or from the junction point E to the ground.

The high frequency signal received by the second antenna does not flow into the receiver circuit port $R_x$, since the third diode D3 is in the OFF state.

(2) TRANSMISSION CONDITION FROM FIRST ANTENNA PORT ANT1 & RECEPTION CONDITION FROM SECOND ANTENNA PORT ANT2 (OP2)

Contrary to the above-described item (1), in the first high frequency switch circuit SW10, a positive control voltage is applied to the control voltage terminal $V_{cc1}$, and the ground potential is applied to the control voltage terminal $V_{cc2}$. As a result, the bias voltage is applied to the first diode D1 in the forward direction, so that this diode D1 is turned ON. The control current supplied from the control voltage terminal $V_{cc1}$, may flow through the circuit controlled by the capacitors C1 to C4, namely via the distributed constant signal line $SL_1$, the first diode D1, and the distributed constant signal line $SL_2$ into the circuit of the control voltage terminal $V_{cc2}$.

In the series circuit arranged by the distributed constant signal line $SL_1$, and the capacitor C3 connected from the junction point A to the ground potential, one end of the distributed constant signal line $SL_1$ can be set to the ground potential in view of the high frequency and the impedance of this series circuit become infinite, as viewed from the junction point A, by the impedance inversion of the λ/4signal line. Similarly, on the side of the distributed constant signal line $SL_2$, the impedance of the series circuit becomes infinite, as viewed from the junction point B. Accordingly, the high frequency signal may flow between the transmitter circuit port $T_x$ and the first antenna port T1.

On the other hand, opposite to the above-explained case (1), in the second high frequency switch circuit SW20, the ground potential is given to the control voltage terminal $V_{cc3}$, and the positive power supply voltage $V_{cc}$ is applied as the control voltage to the control voltage terminal $V_{cc4}$. As a result, the bias voltage is applied to the second diode D2 along the reverse direction, whereas the bias voltage is applied to the third diode D3 along the forward direction, so that the second diode D2 is brought into the OFF state, and the third diode D3 is brought into the ON state. As a consequence, the control current supplied from the control voltage terminal $V_{cc4}$ may flow through the distributed constant signal line $SL_4$, the third diode D3, and the distributed constant signal line $SL_5$ into the control voltage terminal $V_{cc3}$. Then, no control current may flow into the circuit other than the circuit controlled by the capacitors C7 to C10, and the second diode in the OFF state. Similar to, for instance, the above-explained series circuit constructed of the distributed constant signal line SLI and the capacitor C3, a series circuit constructed of the distributed constant signal line $SL_5$ and the capacitor C8 connected from the junction point I to the ground potential has an infinite impedance, as viewed from the junction I. Similarly, an impedance of the distributed constant signal line $SL_4$ also becomes infinite, as viewed from the junction point E. As a consequence, the high frequency signal received from the second antenna port ANT2 does not flow from the junction I or the junction E to the ground potential, but flows into the receiver circuit port $R_x$.

The high frequency signal received from the first antenna and transmitted from the first antenna port ANT1 does not flow into the receiver circuit port $R_x$, because the second diode D2 is in the OFF state.

By this operation, the high frequency signal may flow between the second antenna port ANT2 and the receiver circuit port $R_x$.

(3) CONNECTION CONDITION BETWEEN FIRST ANTENNA AND TRANSMITTER CIRCUIT CONNECTION CONDITION BETWEEN FIRST ANTENNA AND RECEIVER CIRCUIT (OP3)

Similar to the above-explained operation (2), in the first high frequency switch circuit SW10, a positive control voltage is applied to the control voltage terminal $V_{cc1}$, a control voltage at the ground potential is applied to the control voltage terminal $V_{cc2}$, and the bias voltage is applied to the first diode D1 in the forward direction, so that this first diode D1 is brought into the ON state. As a consequence, the circuit between the first antenna port ANT1 and the transmitter circuit port $T_x$ is connected.

Similar to the above-explained operation (1), in the second high frequency switch SW20, a positive power supply voltage $V_{cc}$ is applied as the control voltage to the control voltage terminal $V_{cc3}$, a control voltage at the ground terminal is applied to the control voltage terminal $V_{cc4}$, and the bias voltage is applied to the second diode D2 along the forward direction so as to turn ON this second diode D2, whereas the bias voltage is applied to the third diode D3 along the reverse direction in order to turn OFF this third diode D3. As a result, the circuit between the first antenna port ANT1 and the receiver circuit port $R_x$ is connected, and the connection between the second antenna port ANT2 and the receiver circuit port $R_x$ is interrupted.

As described above, in the high frequency hybrid switch according to the first embodiment, the input/output signal path of the high frequency signal is switched by employing the diodes and the distributed constant signal lines. The distributed constant signal lines $SL_1$ to $SL_5$ constitute the current path for causing the control current to flow into the first to third diodes D1 to D3. That is, the impedances of the distributed constant signal lines, as viewed from the junction points A, B, F, E, I, are increased. Also, both of the insertion loss and the reflection loss are reduced.

It should be noted that in the above-explained example, the positive power supply voltage $V_{cc}$ and the ground potential (=0V) have been employed as the control voltages applied to the respective control voltage terminals $V_{cc}$, to $V_{cc4}$ in order to turn ON/OFF or switch the connections between the respective ports. Alternatively, the present invention is not limited to such a voltage combination ($V_{cc}$ and 0V) as the control voltages.

For instance, the ground potential (0V) may be combined with the negative power supply potential ($-V_{cc}$). For example, in the above operation OP2, the positive power supply voltage $V_{cc}$ is applied to the control voltage terminal $V_{cc1}$, and the ground potential is applied to the control voltage terminal $V_{cc2}$ in order to turn ON the first diode D1 of the first high frequency switch circuit SW10. Alternatively, the ground potential (0V) may be applied to the control voltage terminal $V_{cc1}$ and the negative power supply voltage ($-V_{cc}$) may be applied to the control voltage terminal $V_{cc2}$, so that the bias voltage may be applied to the first diode D1 in the forward direction, thereby turning ON this diode D1.

HIGH FREQUENCY HYBRID SWITCH ACCORDING TO A SECOND EMBODIMENT

Various modifications may be applied to the first high frequency switch circuit SW10 and the second high frequency switch circuit SW20 employed in the high frequency hybrid switch shown in FIG. 1 (will be discussed later). In this second embodiment, a description will now be made of a modification related to the first high frequency switch circuit SW10 according to the first embodiment. FIG. 3 is a circuit diagram for representing the modification of the first high frequency switch circuit SW10. Referring now to FIG. 3, in the first high frequency switch circuit SW10, a capacitor C24, a distributed constant signal line $SL_{21}$, and a capacitor C23 are connected between the first antenna port ANT1 and the transmitter circuit port $T_x$. The distributed constant signal line $SL_{21}$ is arranged as a stripline, a micro stripline, or a coplanar guide line each of which having a length shorter than, or equal to ¼ of the wavelength λ of the transmission high frequency signal. A first diode D21 and a capacitor C21 are series-connected between the ground potential, and the junction point A between the distributed constant signal line $SL_{21}$, and the capacitor C23. An anode of the first diode D21 is connected to the junction point A, and a cathode thereof is connected to the capacitor C21. A control voltage terminal $V_{cc21}$ is connected via a resistor R21 to a junction point C between the first diode D21 and the capacitor C21. It should be noted that the resistor R21 is employed so as to control a voltage value of a control voltage applied from the control voltage terminal $V_{cc21}$, and may be properly provided, if required.

One end of a distributed constant signal line $SL_{22}$ is connected to a junction point B between the distributed constant signal line $SL_{21}$ and the first antenna port ANT1. Similar to the distributed constant signal line $SL_{21}$, the distributed constant signal line $SL_{22}$ is arranged as a stripline, a micro stripline, or a coplanar guide line having a length less than λ/4. Furthermore, the other end of the distributed constant signal line $SL_{22}$ is connected via a capacitor C22 to the ground potential. A junction point D between the distributed constant signal line $SL_{22}$ and the capacitor C22 is connected via a resistor R22 to the control voltage terminal $V_{cc22}$.

Although not shown in the drawing, similar to the above case of FIG. 1, capacitors may be connected between the ground potential and the junction points A, B, respectively. Moreover, not all of these capacitors are necessarily employed, but any one of them may be employed.

Referring now to FIG. 4, operations of the first high frequency switch circuit SW10 having the above-explained circuit arrangement will be explained. FIG. 4 is a control operation explanatory diagram for representing control voltages and connection conditions among the ports related to the first high frequency switch circuit SW10, among the control voltages and the connection conditions between the ports when the high frequency hybrid switch shown in FIG. 2 is operated.

First, in the case (OP1) that the connection established between the first antenna port ANT1 and the transmitter circuit port $T_x$ is opened, the ground potential (OV) is applied to the control voltage terminal $V_{cc21}$, and the positive power supply voltage ($V_{cc}$) is applied to the control voltage terminal $V_{cc22}$. In this case, the bias voltage is applied to the first diode D21 in the forward direction. As a result, the first diode D21 is brought into the ON state. Accordingly, the junction point A is grounded by way of the diode, and then the connection between the first antenna port ANT1 and the transmitter circuit port $T_x$ is interrupted.

Also, under the transmission condition, namely under such a connection condition (OP2, 3) established between the first antenna port ANT1 and the transmitter circuit port $T_x$, a positive voltage is applied to the control voltage terminal $V_{cc21}$, whereas the ground potential is applied to the control voltage terminal $V_{cc22}$. As a result, the bias voltage in the reverse direction is applied to the first diode D21, so that this first diode D21 is brought into the OFF state. Consequently, only the junction point A is grounded by a very small capacitance when the diode is turned OFF, and is released from the ground potential. Accordingly, the first antenna port ANT1 is connected to the transmitter circuit port $T_x$, so that the transmission high frequency signal is transmitted between these first antenna and transmitter circuit ports.

HIGH FREQUENCY HYBRID SWITCH ACCORDING TO A THIRD EMBODIMENT

Figures 5, 6:
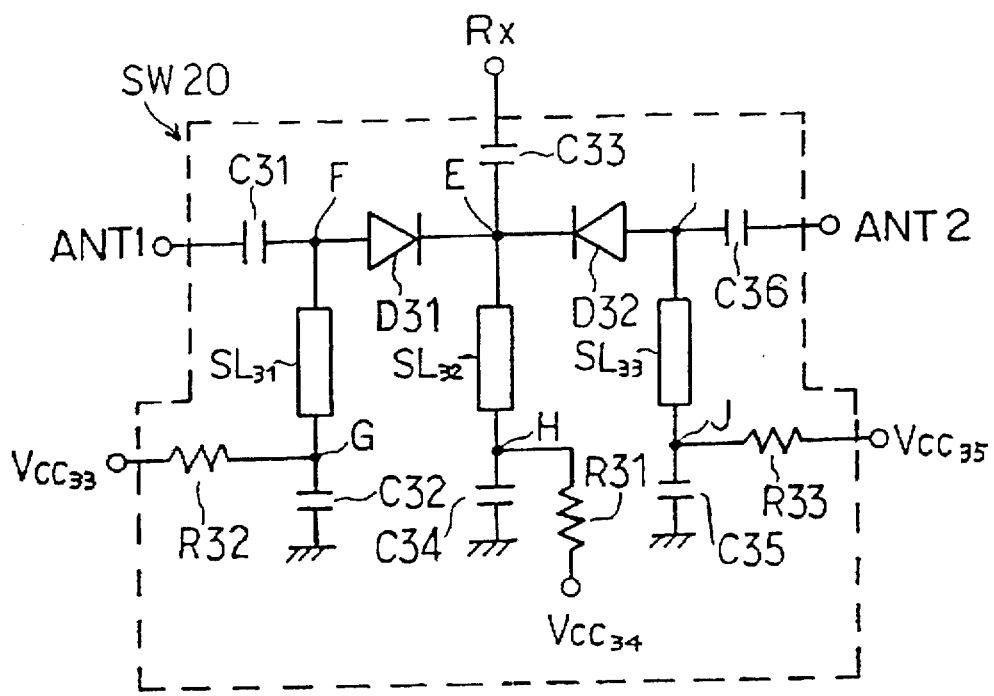
FIG. 5 is a circuit diagram for showing a second high frequency switch circuit of a high frequency hybrid switch according to a third embodiment of the present invention.
FIG. 6 is an explanatory diagram for explaining a control operation of the second high frequency switch circuit indicated in FIG. 5.

FIG. 5 is a circuit diagram for showing a second high frequency switch circuit SW20 of a high frequency hybrid switch according to a third embodiment of the present invention. The second high frequency switch circuit SW20 indicated in FIG. 5 has such a circuit arrangement wherein a connection direction of a third diode D32 to the receiver circuit port $R_x$ is different from that of the above-explained second high frequency switch circuit SW20 shown in FIG. 1. In other words, the third diode D32 is arranged in such a manner that a cathode thereof is connected to the receiver circuit port $R_x$, and an anode thereof is connected via a capacitor C36 to the second antenna port ANT2. Also, to apply such bias voltages to the second and third diodes D31 and D32 so as to be alternately brought into ON/OFF states, control voltages having different potentials are applied to the control voltage terminals $V_{cc33}$ and $V_{cc35}$, respectively. Other circuit arrangements of the third embodiment are similar to those of the first embodiment.

Although not shown in the drawing, similar to the case of FIG. 1, capacitors may be connected between the reference potential and the junction points F, E, I. Moreover, all of these capacitors need not be employed, but any one of them may be connected.

With reference to a control operation explanatory diagram of FIG. 6, operations of the high frequency switch circuit SW20 according to the third embodiment will now be explained.

In the first case (OP1, 3) when the reception condition from the first antenna ANT1 is selected, a positive control voltage is applied to the control voltage terminal $V_{cc33}$, and a control voltage of the ground potential (OV) is applied to the control voltage terminals $V_{cc34}$ and $V_{cc35}$. As a result, the second diode D31 is turned ON and the third diode D32 is turned OFF. Accordingly, a transmission path of a high frequency signal is fabricated between the first antenna port ANT1 and the receiver circuit port $R_x$, and the transmission path between the second antenna port ANT2 and the receiver circuit port Rx is interrupted. In this case, since the impedances on the side of the distributed constant signal lines $SL_{31}$ and $SL_{32}$ become substantially infinite, as viewed from the junction points F and E, the transmission of the high frequency signal received from the first antenna port ANT1 to the ground side is disturbed.

It should be noted that since the first high frequency switch circuit SW10 in the case of OP3 is brought into the ON state, this first high frequency switch circuit SW10 must be isolated from the transmission high frequency signal. In this case, the transmission high frequency signal is interrupted on the receiver circuit.

In the reception condition from the second antenna (OP2), a positive control voltage is applied to the control voltage terminal $V_{cc35}$, and on the other hand, a control voltage of the ground potential (OV) is applied to the control voltage terminals $V_{cc33}$ and $V_{cc34}$. As a result, opposite to the above-explained case, the second diode D31 is brought into the OFF state and the third diode D32 is brought into the ON state. Accordingly, a transmission path of the high frequency signal is formed between the second antenna port ANT2 and the receiver circuit port $R_x$, and a transmission path of the high frequency signal between the first antenna port ANT1 and the receiver circuit port $R_x$ is interrupted. Also in this case, similar to the above-described case, the impedances on the side of the distributed constant signal lines $SL_{32}$ and $SL_{33}$ become infinite, which functions to interrupt the transmission of the high frequency signal from the second antenna port ANT2 to the ground side.

When the first high frequency switch circuit SW10 is in the ON state, the second diode D31 is in the OFF state, so that isolation from the first high frequency switch circuit SW10 can be maintained.

HIGH FREQUENCY HYBRID SWITCH ACCORDING TO A FOURTH EMBODIMENT

Figure 7:
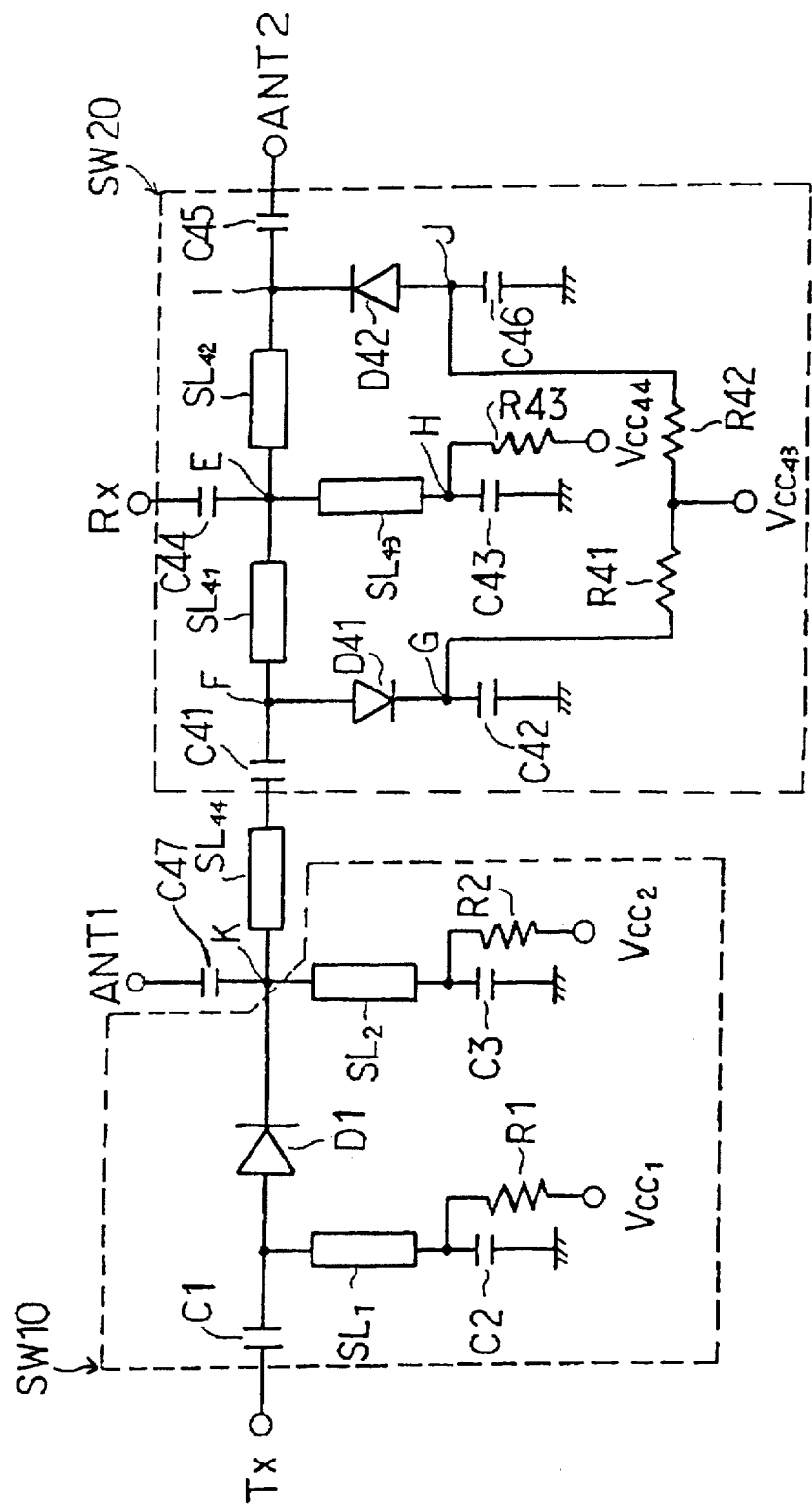
FIG. 7 is a circuit diagram for showing a high frequency hybrid switch according to a fourth embodiment of the present invention.

FIG. 7 is a circuit diagram for showing a high frequency hybrid switch according to a fourth embodiment of the present invention. In FIG. 7, a circuit arrangement of a first high frequency switch circuit SW10 is similar to that of the first embodiment shown in FIG. 1, and a circuit arrangement of a second high frequency switch circuit SW20 is different from that of the first embodiment. A description will now be made of this circuit arrangement of the second high frequency switch circuit SW20.

First ends of distributed constant signal lines $SL_{41}$ and $SL_{42}$ are connected via a capacitor C44 to the receiver circuit port $R_x$.

The other end of the distributed constant signal line $SL_{41}$ is connected via a capacitor C41, a distributed constant signal line $SL_{44}$ for an isolation purpose, and a capacitor C47 to the first antenna port ANT1. The distributed constant signal line $SL_{44}$ for the isolation purpose is constructed of a stripline, a micro stripline, or a coplanar guide line each of which having a length shorter than, or equal to $\lambda/4$ when a wavelength of the transmission high frequency signal is selected to be "$\lambda$".

An anode of a second diode D41 is connected to a junction point "F" between the distributed constant signal line $SL_{41}$ and the capacitor C41, and a cathode of the second diode D41 is connected via a capacitor C42 to the ground potential. Furthermore, a control voltage terminal $V_{cc43}$ is connected via a resistor R41 to a junction point G between the second diode D41 and the capacitor C42.

On the other hand, the other end of this distributed constant signal line $SL_{42}$ is connected via a capacitor C45 to the second antenna port ANT2. A cathode of a third diode D42 is connected to a junction point I between the distributed constant signal line $SL_{42}$ and the capacitor C45, and an anode of the third diode D42 is connected via a capacitor C46 to the ground potential. Furthermore, a control voltage terminal $V_{cc43}$ is connected via a resistor R42 to a junction point J between the third diode D42 and the capacitor C46. It should be noted that this control voltage terminal $V_{cc43}$ is commonly connected to the junction point G and the junction point J.

Also, one end of the distributed constant signal line $SL_{43}$ is connected to a junction point E between the distributed constant signal lines $SL_{41}$, $SL_{42}$ and the receiver circuit port $R_x$, whereas the other end thereof is connected via a capacitor C43 to the ground potential. Furthermore, another control voltage terminal $V_{cc44}$ is connected via a resistor R43 to a junction point H between the distributed constant signal line SL43 and the capacitor C43.

It should be understood that although not shown in FIG. 7, similar to the above case of FIG. 1, capacitors may be connected between the reference potential and the junction points F, E, I, respectively. Moreover, all of these capacitors need not be employed, but any one of them may be connected thereto.

Operations of the second high frequency switch circuit of the above-explained high frequency hybrid switch will now be explained with reference to a control operation explanatory diagram indicated in FIG. 8.

(1) RECEPTION CONDITION (OP2) FROM SECOND ANTENNA PORT ANT2

First of all, the ground potential is applied to the control voltage terminal $V_{cc43}$ and a positive power supply voltage ($V_{cc}$) is applied as the control voltage to the control voltage terminal $V_{cc44}$. As a result, a bias voltage is applied to the second diode D41 in the forward direction, so that the second diode D41 is turned ON. On the other hand, a bias voltage is applied to the third diode D43 in the reverse direction, so that this third diode D42 is turned OFF. Accordingly, the control current may flow from the control voltage terminal $V_{cc44}$ via the distributed constant signal line $SL_{43}$, the distributed constant signal line $SL_{41}$, the second diode D41, and the resistor R41 to the control voltage terminal $V_{cc43}$. Under this condition, the high frequency signal received from the second antenna is transmitted to such a transmission path from the second antenna port ANT2 via the distributed constant signal line $SL_{42}$ to the receiver circuit port $R_x$. At this time, as viewed from the junction point E, since the impedance on the side of the distributed constant signal line $SL_{43}$ becomes substantially infinite, the transmission of the high frequency signal to the ground can be prevented.

It should be noted that no transmission process is carried out in the case of the reception condition from the second antenna (ANT2). To the contrary, even under reception condition, the impedance on the side of the second high frequency switch circuit SW20, viewed from the junction point K, becomes infinite due to the distributed constant signal line $SL_{44}$. Thus, it is interrupted that the transmission high frequency signal flows into the second high frequency switch circuit SW20, so that the signal transmission from the first antenna (ANT1) is available.

(2) RECEPTION CONDITION (OP3/OP1) FROM FIRST ANTENNA PORT (ANT1)

In this case, opposite to the above case, the positive power supply voltage is applied to the control voltage terminal $V_{cc43}$, and the ground potential is applied to the control voltage terminal $V_{cc44}$, so that the second diode D41 is set to the OFF state and the third diode D42 is set to the ON state. As a consequence, the reception signal transmitted from the first antenna port ANT1 is transmitted to the receiver circuit port $R_x$.

HIGH FREQUENCY HYBRID SWITCH ACCORDING TO A FIFTH EMBODIMENT

Figures 9, 10:
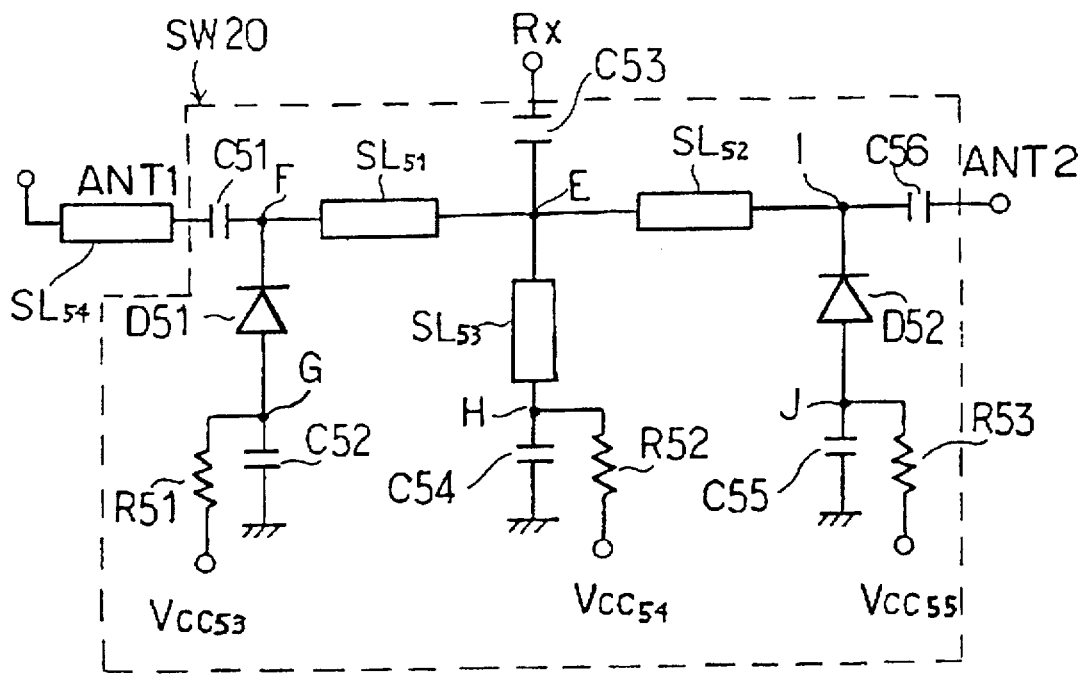
FIG. 9 is a circuit diagram for showing a second high frequency switch circuit of a high frequency hybrid switch according to a fifth embodiment of the present invention.
FIG. 10 is an explanatory diagram for explaining a control operation of the second high frequency switch circuit indicated in FIG. 9.

FIG. 9 is a circuit diagram for representing a second high frequency switch circuit SW20 of a high frequency hybrid switch according to a fifth embodiment of the present invention. This embodiment will constitute a modification of the second high frequency switch circuit SW20 according to the above-explained fourth embodiment. This fifth embodiment has an arrangement in which a connection direction of a second diode D51, and voltages applied to control voltage terminals $V_{cc53}$ and $V_{cc55}$ are different from those of the above-explained embodiment. Other arrangements of this fifth embodiment are similar to those of the fourth embodiment.

That is, as shown in FIG. 9, a cathode of the second diode D51 is connected to a junction point F between a distributed constant signal line $SL_{51}$ and a capacitor C51, and an anode thereof is connected via a capacitor C52 to the ground potential. A third diode D52 is connected in a similar manner to the third diode D52 of the fourth embodiment. Then, the control voltage terminal $V_{cc53}$ is connected via a resistor R51 to a junction G between the second diode D51 and the capacitor C52, whereas the control voltage terminal $V_{cc55}$ is connected via a resistor R53 to a joint point J between the third diode D52 and a capacitor C55. These control voltage terminals $V_{cc53}$ and $V_{cc55}$ are separately provided.

Referring now to FIG. 10, operations of the second high frequency switch circuit according to the fifth embodiment will be explained.

(1) RECEPTION CONDITION (OP1, 3) BY FIRST ANTENNA PORT (ANT1)

A positive power supply voltage is applied to the control voltage terminal $V_{cc55}$, and the ground potential is applied to the control voltage terminals $V_{cc53}$ and $V_{cc54}$. As a result, a bias voltage is applied to the third diode D52 in the forward direction, thereby turning this diode D52 ON, whereas a bias voltage is applied to the second diode D51 in the reverse direction, thereby turning this diode D51 OFF. Accordingly, a transmission path for a high frequency signal is established between the first antenna port ANT1 and the receiver circuit port $R_x$, and a transmission path established between the second antenna port ANT2 and the receiver circuit port $R_x$ is interrupted.

(2) RECEPTION CONDITION (OP2) BY SECOND ANTENNA PORT (ANT2)

Opposite to the above case (1), the ground potential is applied to the control voltage terminals $V_{cc54}$, $V_{cc55}$, and further a positive power supply voltage is applied to the control voltage terminal $V_{cc53}$. As a result, the second diode D51 is brought into the ON state, whereas the third diode D52 is brought into the OFF state. Consequently, a transmission path for a high frequency signal is formed between the second antenna port ANT2 and the receiver circuit port $R_x$.

HIGH FREQUENCY HYBRID SWITCH ACCORDING TO A SIXTH EMBODIMENT

Figure 11:
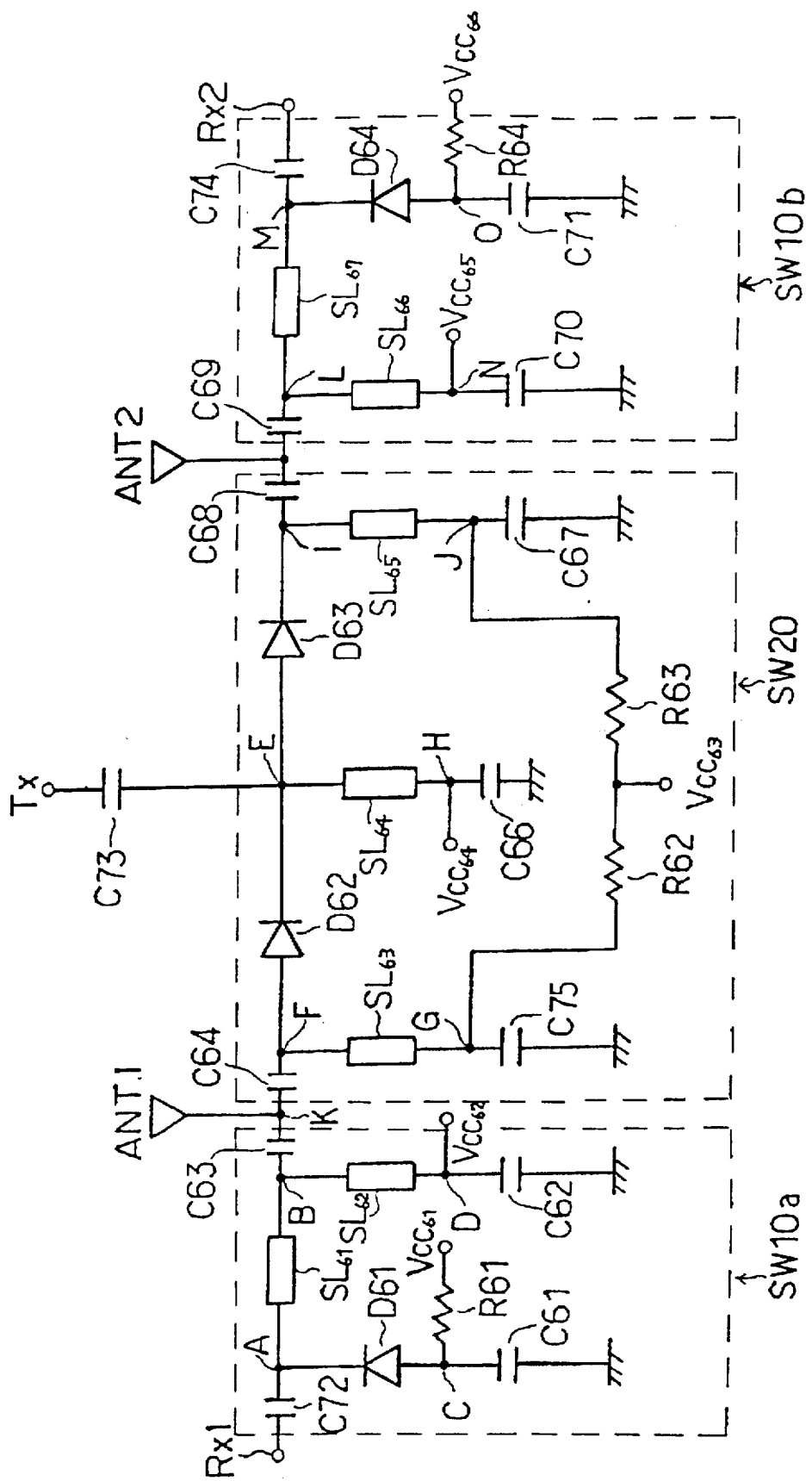
FIG. 11 is a circuit diagram for showing a port high frequency hybrid switch according to a sixth embodiment of the present invention.

FIG. 11 is a circuit diagram for showing a high frequency hybrid switch according to a sixth embodiment of the present invention. The high frequency hybrid switch according to this sixth embodiment corresponds to a 5-port high frequency hybrid switch having 5 ports for switching connections between two antennas, two receiver circuits and one transmitter circuit.

The high frequency hybrid switch indicated in FIG. 11 has such a circuit arrangement in which a first high frequency switch circuit SW10a is arranged between a first antenna port ANT1 and a first receiver circuit $R_{X1}$, and a second high frequency switch circuit SW20 is arranged among the first antenna port ANT1, the second antenna port ANT2, and a transmitter circuit port $T_{x1}$, and further a first high frequency switch circuit SW10b is arranged between a second antenna port ANT2 and a second receiver circuit port $R_{X2}$. It should be noted that two sets of these first high frequency switch circuits SW10 a and SW10 b have similar circuit arrangements to each other. In this sixth embodiment, this first high frequency switch circuit is so arranged that the diodes are connected in the opposite directions as to the first high frequency switch circuit SW10 of the second embodiment.

Also, the second high frequency switch circuit SW20 has a similar circuit arrangement to that of the second high frequency switch circuit employed in the first embodiment, shown in FIG. 1. As a consequence, the circuit arrangements of the first high frequency switch circuits SW10a, SW10b, and the second high frequency switch circuit SW20 employed in the sixth embodiment may be understood from the descriptions made in the first and second embodiments, and therefore explanations thereof are omitted in this embodiment. It should also be noted that the circuit arrangement of the first embodiment shown in FIG. 1 may be applied to these first high frequency switch circuits SW10a and SW10b, and also the circuit arrangements according to the third to fifth embodiments may be applied to the second high frequency switch circuit SW20.

Furthermore, although not shown in this drawing, similar to the case shown in FIG. 1, capacitors may be connected between the reference potential and each of the junction points A, B, F, E, I, L, M. Moreover, all of these capacitors need not be employed, but only any only of them may be connected.

As represented in FIG. 12, this 5-port high frequency hybrid switch may switch any one of four transmission/ reception conditions (OP1 to OP4), which will be explained in detail.

(1) ONLY TRANSMISSION CONDITION (OP1) FROM FIRST ANTENNA PORT (ANT1)

First, in the second high frequency switch circuit SW20, a positive power supply voltage is applied to a control voltage terminal $V_{cc63}$, and further the ground potential is applied to a control voltage terminal $V_{cc64}$. As a result, a bias voltage in the forward direction is applied to a second diode D62 so as to thereby be brought into the ON state. On the other hand, a bias voltage in the reverse direction is applied to a third diode D63 so as to thereby be brought into the OFF state. As a consequence, a transmission path for a high frequency signal is established between the first antenna port ANT1 and the transmitter circuit port $T_x$, whereas no transmission path for the high frequency signal is formed between the second antenna port ANT2 and the receiver circuit port $T_x$. As viewed from the junction points E and F toward two distributed constant signal lines $SL_{64}$ and $SL_{63}$, since impedances thereof become infinite, the transmission high frequency signal is not transmitted from the junction points E and F to the ground side.

Furthermore, in this mode, no connection is made between the first and second antennas, and the first and second receiver circuits. As a consequence, any of the first high frequency switch circuits SW10a and SW10b is set to such a condition that the transmission path for the high frequency signal is closed. In other words, in the first high frequency switch circuit SW10a, the positive power supply voltage is applied to the control voltage terminal $V_{cc61}$, and further the ground potential is applied to the control voltage terminal $V_{cc62}$, so that the first diode D61 is set to the ON sate. In the first high frequency switch circuit SW10b, the ground potential is applied to the control voltage terminal $V_{cc65}$, and the positive power supply voltage is applied to the control voltage terminal $V_{cc66}$, so that a fourth diode D64 is set to the ON state.

(2) ONLY TRANSMISSION CONDITION (OP2) FROM SECOND ANTENNA PORT (ANT2)

In this case, since operations of the two first high frequency switch circuits SW10a and SW10b are similar to those of the above-explained case (1), an operation of the second high frequency circuit SW20 will be explained.

That is, the ground potential is applied to the control voltage terminal $V_{cc63}$ and a positive power supply voltage is applied to the other voltage control terminal $V_{cc64}$. As a consequence, a bias voltage is applied to the second diode D62 in the reverse direction, so that this second diode D62 is set to the OFF state. A bias voltage is applied to the third diode D63 in the forward direction, so that this third diode D63 is brought into the ON state. Accordingly, a transmission path for the transmission high frequency signal is formed between the transmission circuit port $T_x$ and the second antenna port ANT2.

(3) RECEPTION CONDITION (OP3) BY FIRST ANTENNA PORT

In the first high frequency switch circuit SW10a, the ground potential is applied to the control voltage terminal $V_{cc61}$, and a positive power supply voltage is applied to the control voltage terminal $V_{cc62}$. As a result, the first diode D61 is brought into the OFF state, and thus, a transmission path for the reception signal is established between the first antenna port ANT1 and the first receiver circuit port $R_{X1}$.

On the other hand, in the first high frequency switch circuit SW10b, the ground potential is applied to the control voltage terminal $V_{cc65}$, and a positive power supply voltage is applied to the control voltage terminal $V_{cc66}$. As a result, the fourth diode D64 is turned ON. Accordingly, no transmission path for the high frequency signal is established between the second antenna port ANT2 and the second receiver circuit port $R_{X2}$.

In the case of the reception condition by the first antenna, although the second high frequency switch circuit SW20 connects between the second antenna port ANT2 and the transmitter circuit port $T_x$, it is so arranged not to transmit the high frequency signal from the second antenna.

(4) RECEPTION CONDITION (OP4) FROM SECOND ANTENNA PORT

In the first high frequency switch circuit SW10a, the ground potential is applied to the control voltage terminal $V_{cc62}$, and a positive power supply voltage is applied to the control voltage terminal $V_{cc61}$. As a result, the first diode D61 is brought into the ON state, and thus, no transmission path for the reception signal is established between the first antenna port ANT1 and the first receiver circuit port $R_{X1}$.

Furthermore, in the first high frequency switch circuit SW10b, the ground potential is applied to the control voltage terminal $V_{cc66}$, and a positive power supply voltage is applied to the control voltage terminal $V_{cc65}$. As a result, the fourth diode D64 is turned OFF. Accordingly, a transmission path for the high frequency signal is established between the second antenna port ANT2 and the second receiver circuit port $R_{X2}$.

In the case of the reception condition by the second antenna, although the second high frequency switch circuit SW20 connects between the first antenna port ANT1 and the transmitter circuit port $T_x$, it is so arranged not to transmit the high frequency signal from the first antenna.

VARIOUS MODIFICATIONS

Next, a description will be made of preferred modifications of the high frequency hybrid switch circuits according to the above-explained first to sixth embodiments.

Figure 18:
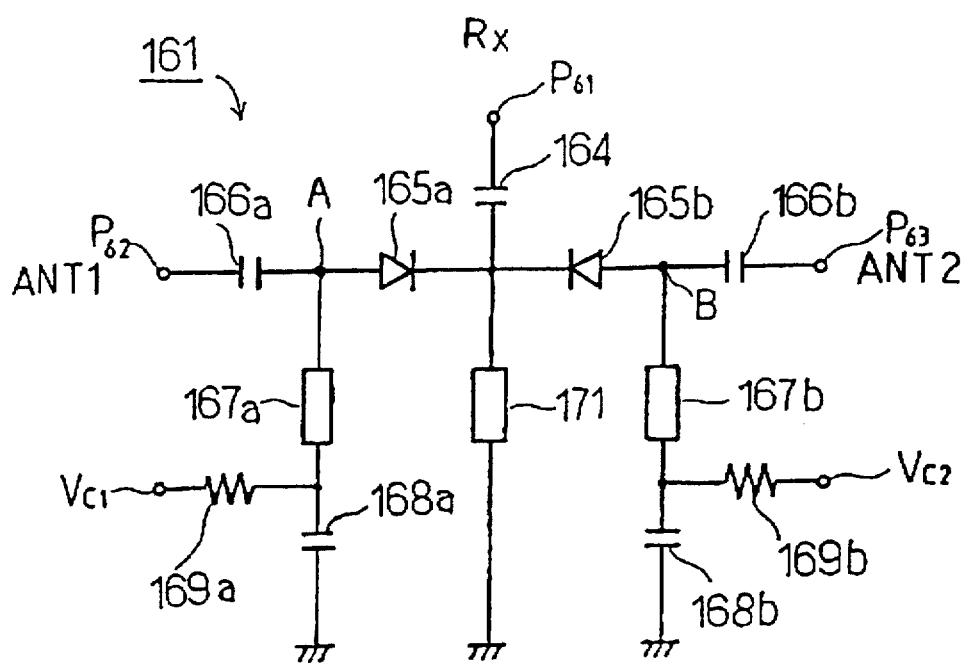
FIG. 18 is a circuit diagram of the 3-port high frequency switch used as the conventional antenna diversity type selecting switch.

As the second high frequency switch circuit SW20 employed in the high frequency hybrid switches of the first to sixth embodiments, the high frequency switch indicated in FIG. 18 may be applied.

Figure 13:
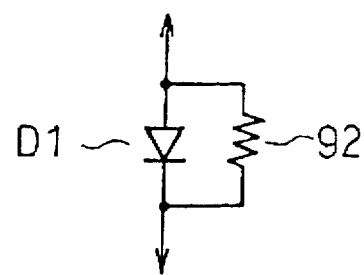
FIG. 13 is a circuit diagram for describing a high frequency switch circuit according to one preferred modification of the present invention.

In a modification shown in FIG. 13, a discharge resistor 92 is connected parallel to a diode D1. When the diode D1 is in the OFF state, this diode D1 functions as a capacitor in view of DC current. As a consequence, the electric charges stored in the OFF state may flow at the same time the diode D1 is brought into the ON state. In the circuit arrangement of FIG. 13, the stored electric charges are discharged via the discharge resistor 92. As a consequence, the switching operations from the OFF state of the diode D1 into the ON state are smoothly performed.

Figure 14:
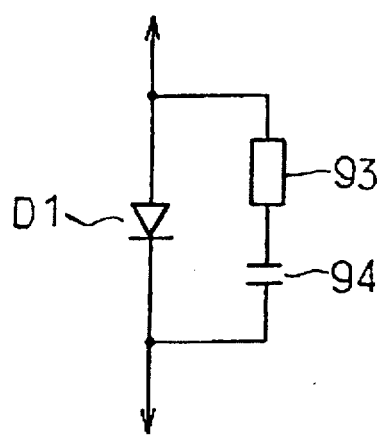
FIG. 14 is a circuit diagram for describing a high frequency switch circuit according to another preferred modification of the present invention.

In another modification represented in FIG. 14, a series connection between a distributed constant signal line 93 and a capacitor 94 is connected parallel to a diode D1. In this modification arrangement, a parallel resonant circuit is constructed of the capacitance in the OFF state of the diode q and the inductance of the distributed constant signal line 93. As a consequence, when the inductance of this distributed constant signal line 93 is adjusted in such a manner that the resonance frequency of this parallel resonant circuit is coincident with the frequency of the transmitted high frequency signal, the impedance when the diode D1 is in the OFF state is increased. Accordingly, the isolation characteristic between the subsequent ports for sandwiching the diode D1 in the OFF state can be improved. It should be noted that a capacitor 94 is so employed as to prevent the DC current from being bypassed by the distributed constant signal line 93. As described above, the distributed constant signal line 93 is arranged as a stripline, a micro stripline, or a coplanar guide line. The lengths and the impedances thereof are selected in such a manner that the resonant frequency of the above-explained parallel resonant circuit is coincident with the frequency of the high frequency signal.

Figure 15:
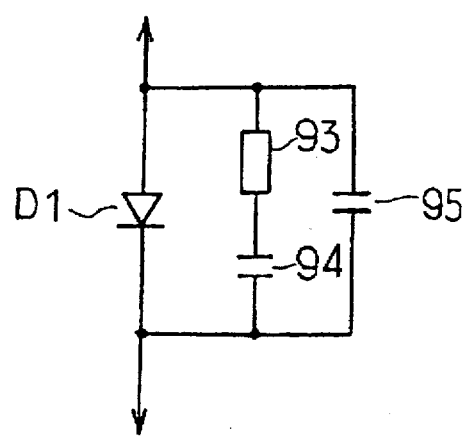
FIG. 15 is a circuit diagram for describing a high frequency switch circuit according to a further preferred modification of the present invention.
Figure 16:
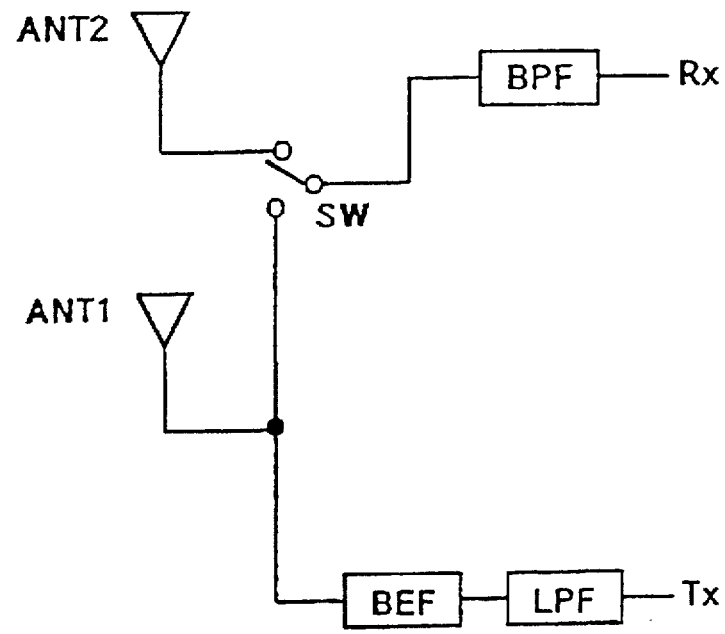
FIG. 16 is a schematic structural diagram for showing one example of the conventional antenna diversity type selecting switch.
Figure 17:
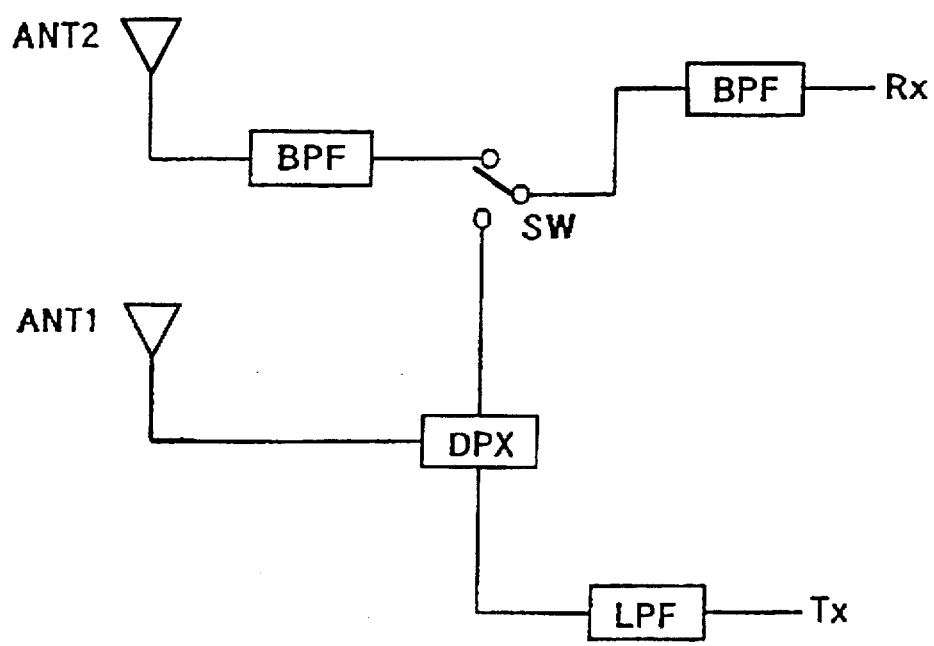
FIG. 17 is a schematic structural diagram for representing another example of the conventional antenna diversity type selecting switch.

In another modification shown in FIG. 15, a distributed constant signal line 93 is connected parallel to a diode D1 in order to constitute a parallel resonant circuit. Also, a capacitor 94 is connected in series to the distributed constant signal line 93. Furthermore, another capacitor 95 is connected in parallel to the diode D1 and also in parallel to the circuit portion constructed of the distributed constant signal line 93 and the capacitor 94. Since such a capacitor 95 is additionally employed, when the capacitance of the diode D1 in the OFF state is small in the circuit arrangement of FIG. 14, a parallel resonance circuit may be constituted by a combined capacitance between the capacitance of the diode D1 in the OFF state and the capacitance of the capacitor 94, and the inductance component of the distributed constant signal line 93. As a consequence, the parallel resonant frequency of this parallel resonant circuit may be easily made coincident with the frequency of the high frequency signal.

It should be understood that the discharge resistor 92 shown in FIG. 13 may be further connected to the diode D1 in a parallel manner with respect to the modification indicated in FIG. 15.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A high frequency hybrid switch comprising: first, second, third and fourth ports; a first high frequency switch circuit for switching a connection established between the first port and the third port; and a second high frequency switch circuit for selecting one of two connections respectively established between the first port and the fourth port, and between the second port and the fourth port; wherein:

said first high frequency switch circuit includes:

a first diode connected between said first port and said third port;

capacitors respectively connected between said first port and said first diode, and between said third port and said first diode; two series circuits each including a distributed constant signal line and a capacitor, which are connected between a reference potential and respective junction points between said first diode and said capacitors connected to said first diode; and first and second control voltage terminals each connected to a respective junction point between one of said distributed constant signal lines and the capacitor series-connected to the respective distributed constant signal line; and said second high frequency switch circuit includes:

a second diode connected between said first port and said fourth port;

a third diode connected between said second port and said fourth port;

first, second and third capacitors respectively connected between said fourth port and said second and third diodes, between said first port and said second diode between said second port and said third diode; and three series circuits each including a distributed constant signal line and a capacitor, which are connected between the reference potential and respective junction points defined between the first, second and third capacitors, and said second and third diodes; and third, fourth and fifth control voltage terminals connected to respective junction points between each of said distributed constant signal lines and the corresponding capacitor series-connected thereto.

2. A high frequency hybrid switch as claimed in claim 1, wherein said second and third diodes are connected in opposite directions with respect to said fourth port.

3. A high frequency hybrid switch as claimed in claim 1, wherein said second and third diodes are connected in the same direction with respect to said fourth port.

4. A high frequency hybrid switch comprising: first, second, third, and fourth ports; a first high frequency switch circuit for switching a connection established between the first port and the third port; and a second high frequency switch circuit for selecting one of two connections respectively established between the first port and fourth port, and between the second port and the fourth port; wherein:

said first high frequency switch circuit includes:

a first diode connected between said first port and said third port;

capacitors respectively connected between said first port and said first diode, and between said third port and said first diode;

a pair of series circuits each comprising a distributed constant signal line and a capacitor series-connected to the distributed constant signal line, each said series circuit being connected between a reference potential and a respective junction point between said first diode and a corresponding one of said capacitors connected to said first diode; and first and second control voltage terminals each connected to a respective junction point defined between one of said distributed constant signal lines and the corresponding one of said capacitors series-connected to the respective distribuyed constant signal line;

said second high frequency switch circuit includes:

a first distributed constant signal line connected between said first port and said fourth port;

a second distributed constant signal line connected between said second port and said fourth port;

first, second and third capacitors connected respectively between said fourth port and said first and second distributed constant signal lines, between said first port and said first distributed constant signal line, and between said second port and said second distributed constant signal line;

a series circuit comprising a distributed constant signal line and a capacitor series-connected to said distributed constant signal line, said series circuit being connected between the reference potetial and said capacitor connected to said fourth port;

a third control voltage terminal connected to a junction point between said distributed constant signal line and said capacitor series-conneced to said distributed constant signal line;

second and third diodes and respective capaictors series-connected to said second and third diodes, which are connected between the reference potential and the respective junction points defined between said respective capacitors connected to said first and second ports, and the corresponding ones of said first and second distributed constant signal lines; and fourth and fifth control voltage terminals connected respectively to junctions defined between said second diode and said capacitor series-connected to said second diode, and between said third diode and said capacitor series-connected to said third diode; and further comprising:

a third distributed constant signal line, connected between said first port, and said capacitor of the second high frequency switch circuit connected to said first port.

5. A high frequency hybrid switch as claimed in claim 4, wherein a connection direction of said second diode with respect to said first port is opposite to that of said third diode with respect to said second port.

6. A high frequency hybrid switch as claimed in claim 4, wherein a connection direction of said second diode with respect to said first port is the same as said third diode with respect to said second port.

7. A high frequency hybrid switch comprising: first, second, third and fourth ports; a first high frequency switch circuit for switching a connection established between the first port and the third port; and a second high frequency switch circuit for selecting one of two connections respectively established between the first port and fourth port, and between the second port and the fourth port; wherein:

said first high frequency switch circuit includes:

a first distributed constant signal line connected between said first port and said third port;

capacitors respectively connected between said first port and said first distributed constant signal line, and between said third port and said first distributed constant signal line;

a series circuit comprising a first diode and a capacitor series-connected to said first diode, said series circuit being connected between a reference potential and a junction point defined between said capacitor connected to said third port and said first distributed constant signal line;

a first control voltage terminal connected to a junction point defined between said first diode and said capacitor series-connected to said first diode;

a series circuit comprising a second distributed constant signal line and a capacitor series-connected to said second distributed constant signal line, said series circuit being connected between the reference potential and a junction defined between said capacitor connected to said first port and said first distributed constant signal line; and a second control voltage terminal connected to a junction point defined between said second distributed constant signal line and said capacitor series-connected to said second distributed constant signal line;

said second high frequency switch circuit includes:

a second diode connected between said first port and said fourth port;

a third diode connected between said second port and said fourth port;

first, second and third capacitors connected respectively between said fourth port and said second and third diodes, between said first port and said second diode, and between said second port, and said third diode;

three series circuits each including a distributed constant signal line and a capacitor, which are connected between the reference potential and respective junction points between the first, second and third capacitors and said second and third diodes; and third, fourth and fifth control voltage terminals connected to respective junction points between each of said distributed constant signal lines and the corresponding capacitor series-connected thereto.

8. A high frequency hybrid switch as claimed in claim 7, wherein said second and third diodes are connected in opposite directions with respect to said fourth port.

9. A high frequency hybrid switch as claimed in claim 7, wherein said second and third diodes are connected in the same direction with respect to said fourth port.

10. A high frequency hybrid switch comprising: first, second, third and fourth ports; a first high frequency switch circuit for switching a connection established between the first port and the third port; and a second high frequency switch circuit for selecting one of two connections respectively established between the first port and the fourth port, and between the second port and the fourth port; wherein:

said first high frequency switch circuit includes:

a first distributed constant signal line connected between said first port and said third port;

capacitors respectively connected between said first port and said first distributed constant signal line, and between said third port and said first distributed constant signal line;

a series circuit comprising a first diode and a capacitor series-connected to said first diode, said series circuit being connected between a reference potential and a junction point defined between said capacitor connected to said third port and said first distributed constant signal line;

a first control voltage terminal connected to a junction point between said first diode and said capacitor series-connected to said first diode;

a series circuit comprising a second distributed constant signal line and a capacitor series-connected to said second distributed constant signal line, said series circuit being connected between the reference potential and a junction between said capacitor connected to said first port and said first distributed constant signal line; and a second control voltage terminal connected to a junction point defined between said second distributed constant signal line and said capacitor series-connected to said second distributed constant signal line;

said second high frequency switch circuit includes;

a third distributed constant signal line connected between said first port and said fourth port;

a fourth distributed constant signal line connected between said second port and said fourth port;

capacitors respectively connected between said fourth port and said third and fourth distributed constant signal lines, between said first port and said third distributed constant signal line, and between said second port and said fourth distributed constant signal line;

a series circuit comprising a distributed constant signal line and a capacitor series-connected to said distributed constant signal line, said series circuit being connected between the reference potential and said capacitor connected to said fourth port;

a third control voltage terminal connected to a junction point between said distributed constant signal line and said capacitor series-connected to said distributed constant signal line;

second and third diodes and respective capacitors series-connected to said second and third diodes, which are connected between the reference potential and the respective junction points defined between said respective capacitors connected to said first and second ports, and the corresponding ones of said third and fourth distributed constant signal lines; and fourth and fifth control voltage terminals connected respectively to junctions defined between said second diode and said capacitor series-connected to said second diode, and between said third diode and said capacitor series-connected to said third diode; and further comprising:

a fifth distributed constant signal line, connected between said first port, and said capacitor of the second high frequency switch circuit connected to said first port.

11. A high frequency hybrid switch as claimed in claim 10, wherein a connection direction of said second diode with respect to said first port is opposite to that of said third diode with respect to said second port.

12. A high frequency hybrid switch as claimed in claim 10, wherein a connection direction of said second diode with respect to said first port is the same as said third diode with respect to said second port.

13. A high frequency hybrid switch comprising: first to fifth ports; a first high frequency switch circuit for switching a connection established between the first port and the third port; a second high frequency switch circuit for selecting two connections respectively established between the first port and the fifth port, and between the second port and the fifth port; and a third high frequency switch circuit for switching a connection established between the second port and the fourth port; wherein:

said first high frequency switch circuit includes:

a first distributed constant signal line connected between said first port and said third port;

capacitors respectively connected between said first port and said first distributed constant signal line, and between said third port and said first distributed constant signal line;

a series circuit of a first diode and a capacitor, said series circuit being connected between a reference potential and a junction point defined between said capacitor corresponding to said third port and said first distributed constant signal line;

a first control voltage terminal connected to a junction point between said first diode and said capacitor series-connected to said first diode;

a series circuit of a second distributed constant signal line and a capacitor, said series circuit being connected between the reference potential and a junction between said capacitor corresponding to said first port and said first distributed constant signal line; and a second control voltage terminal connected to a junction point between said second distributed constant signal line and said capacitor series-connected to said second distributed constant signal line;

said third high frequency switch circuit includes:

a third distributed constant signal line connected between said second port and said fourth port;

capacitors respectively connected between said second port and said third distributed constant signal line, and between said fourth port and said third distributed constant signal line;

a series circuit of a second diode and a capacitor, and series circuit being connected between the reference potential and a junction point defined between said capacitor corresponding to said fourth port and said third distributed constant signal line;

a third control voltage terminal connected to a junction point between said second diode and said capacitor series-connected to said second distributed constant signal line;

a series circuit of a fourth distributed constant signal line and a capacitor, said series circuit being connected between the reference potential and a junction between said third distributed constant signal line and said capacitor corresponding to said second part; and a fourth control voltage terminal connected to a junction point between said fourth distributed constant signal line and said capacitor series-connected to said fourth distributed constant signal line;

said second high frequency switch circuit includes:

a third diode connected between said first port and said fifth port;

a fourth diode connected between said second port and said fifth port, said third and fourth diodes being connected in opposite directions with respect to said fifth port;

capacitors respectively connected between said fifth port and said fourth and third diodes, between said first port and said third diode, and between said second port and said fourth diode; and three series circuits each having a distributed constant signal line and a capacitor, said series circuits being connected respectively between the reference potential and corresponding junction points defined between said fourth and third diodes, between the third diode and the capacitor corresponding to said first port, and between the fourth diode and the capacitor corresponding to said second port; and third to fifth control voltage terminals connected to corresponding the junction points between each of said distributed constant signal lines and said capacitors series-connected to said respective distributed constant signal lines.

14. A high frequency hybrid switch comprising: first to fifth ports; a first high frequency switch circuit for switching a connection established between the first port and the third port; a second high frequency switch circuit for selecting two connections respectively established between the first port and the fifth port, and between the second port and the fifth port; and a third high frequency switch circuit for switching a connection established between the second port and the fourth port; wherein:

said first high frequency switch circuit includes:

a circuit element selected from the group consisting of a first diode and a first distributed constant signal line, connected between said first port and said third port, said third high frequency switch circuit includes:

a circuti element selected from the group consisting of of a second diode and a second distributed constant signal line, connected between said second port and fourth port, and said second high frequency switch circuit includes:

a circuit element selected from the group consisting of a series circuit comprised of third and fourth diodes, connected between said first port and said second port, and a series circuit comprised of third and fourth distributed constant signal lines, connected between said first Port and said second port.

15. A high frequency hybrid switch as claimed in any one of claims 1, 4, 7, 10, 14, or 13, further comprising:

a capacitor connected in parallel to at least one of said diodes.

16. A high frequency hybrid switch as claimed in any one of claims 1, 4, 7, 10, 14 or 13, further comprising:

a resistor connected in parallel to at least one of said diodes.

17. A high frequency hybrid switch as claimed in any one of claims 1, 4, 7, 10, 14 or 13, further comprising:

a series circuit of a distributed constant signal line and a capacitor, said series circuit being connected in parallel to at least one of said diodes.

18. A high frequency hybrid switch as claimed in claim 17, further comprising:

an additional capacitor connected in parallel to at least one of said diodes.

19. A high frequency hybrid switch comprising: first, second, third and fourth ports, a first high frequency switch circuit for switching a connection established between the first port and the third port; and a second high frequency switch circuit for Selecting one of two connections respectively established between the first port and the fourth port, and between the second port and the fourth port; wherein:

said first high frequency switch circuit includes:

a circuit element selected from the group consisting of a first diode and a first distributed constant signal line, connected between said first port and said third port, and said second high frequency switch circuit includes:

a circuit element selected from the group consisting of a series circuit comprised of second and third diodes, connected between said first port and said second port, and a series circuit comprised of second and third distributed constant signal lines, connected between said first port and said second port; and further comprising;

a series circuit of a distributed constant signal line and a capacitor, said series circuit being connected in parallel to at least one of said diodes.

20. A high frequency hybrid switch as claimed in claim 19, further comprising:

an additional capacitor connected in parallel to at least one of said diodes.

21. A high frequency hybrid switch comprising: first, second, third and fourth ports, a first high frequency switch circuit for switching a connection established between the first port and the third port; and a second high frequency switch circuit for selecting one of two connections respectively established between the first port and the fourth port, and between the second port and the fourth port; wherein:

said first high frequency switch circuit includes:

a circuit element selected from the group consisting of a first diode and a first distributed constant signal line, connected between said first port and said third port, and said second high frequency switch circuit includes:

a circuit element selected from the group consisting of a series circuit comprised of second and third diodes, connected between said first port and said second port, and a series circuit comprised of second and third distributed constant signal lines, connected between said first part and said second port; and further comprising;

a capacitor connected in parallel to at least one of said diodes.

22. A high frequency hybrid switch comprising: first, second, third and fourth ports, a first high frequency switch circuit for switching a connection established between the first port and the third port; and a second high frequency switch circuit for selecting one of two connections respectively established between the first port and the fourth port, and between the second port and the fourth port; wherein:

said first high frequency switch circuit includes:

a circuit element selected from the group consisting of a first diode and a first distributed constant signal line, connected between said first port and said third port, and said second high frequency switch circuit includes:

a circuit element selected from the group consisting of a series circuit comprised of second and third diodes, connected between said first port and said second port, and a series circuit comprised of second and third distributed constant signal lines, connected between said first port and said second port; and further comprising:

a resistor connected in parallel to at least one of said diodes.

23. A high frequency hybrid switch comprising: first to fifth ports; a first high frequency switch circuit for switching a connection established between the first port and the third port; a second high frequency switch circuit for selecting two connections respectively established between the first port and the fifth port, and between the second port and the fifth port; and a third high frequency switch circuit for switching a connection established between the second port and the fourth port; wherein:

said first high frequency switch circuit includes:

a two port type high frequency circuit having said first and third ports, said third high frequency switch circuit includes:

a two port type high frequency circuit having said second and fourth ports, said second high frequency switch circuit includes;

a three port type high frequency circuit having said first, second and fifth ports.

* * * * *